(12) United States Patent
Tai et al.

(10) Patent No.: US 10,618,801 B2
(45) Date of Patent: Apr. 14, 2020

(54) MEMS STRUCTURE WITH BILAYER STOPPER AND METHOD FOR FORMING THE SAME

(71) Applicant: Taiwan Semiconductor Manufacturing Co., Ltd., Hsinchu (TW)

(72) Inventors: Wen-Chuan Tai, Hsinchu (TW); Hsiang-Fu Chen, Zhubei (TW); Fan Hu, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 20 days.

(21) Appl. No.: 15/348,648

(22) Filed: Nov. 10, 2016

(65) Prior Publication Data
US 2018/0127263 A1 May 10, 2018

(51) Int. Cl.
*B81B 3/00* (2006.01)

(52) U.S. Cl.
CPC ............ *B81B 3/001* (2013.01); *B81B 3/0008* (2013.01); *B81B 2207/015* (2013.01); *B81C 2203/0735* (2013.01)

(58) Field of Classification Search
CPC .................................................. B81B 3/0013
See application file for complete search history.

(56) References Cited

U.S. PATENT DOCUMENTS

| | | | |
|---|---|---|---|
| 8,987,059 B2 | 3/2015 | Liang et al. | |
| 9,040,334 B2 | 5/2015 | Chu et al. | |
| 9,065,358 B2 | 6/2015 | Tsai et al. | |
| 9,085,455 B2 | 7/2015 | Cheng et al. | |
| 9,085,456 B2 | 7/2015 | Tsai et al. | |
| 9,122,827 B2 | 9/2015 | Chen et al. | |
| 9,133,017 B2 | 9/2015 | Liang et al. | |
| 9,138,994 B2 | 9/2015 | Peng et al. | |
| 9,139,420 B2 | 9/2015 | Chang et al. | |
| 9,139,423 B2 | 9/2015 | Chien et al. | |
| 9,181,083 B2 | 11/2015 | Tsai et al. | |
| 9,187,317 B2 | 11/2015 | Cheng et al. | |
| 9,233,839 B2 | 1/2016 | Liu et al. | |
| 9,236,877 B2 | 1/2016 | Peng et al. | |
| 9,238,581 B2 | 1/2016 | Wu et al. | |
| 9,365,416 B2 | 6/2016 | Shu et al. | |

(Continued)

*Primary Examiner* — Marcos D. Pizarro
*Assistant Examiner* — Quinton A Brasfield
(74) *Attorney, Agent, or Firm* — Birch, Stewart, Kolasch & Birch, LLP

(57) ABSTRACT

Microelectromechanical systems (MEMS) packages and methods for forming the same are provided. The MEMS package includes a semiconductor substrate having a metallization layer over the semiconductor substrate. The MEMS package also includes a first planarization layer and an overlying second planarization layer over the metallization layer. The planarization structure has a first cavity therein exposing the metallization layer. The MEMS package also includes a MEMS device structure bonded to the second planarization layer. The MEMS device structure includes a moveable element over the first cavity. The MEMS package also includes a first stopper placed on the exposed metallization layer in the first cavity. The first stopper includes a patterned conductive layer and an underlying patterned insulating layer.

20 Claims, 13 Drawing Sheets

(56) References Cited

U.S. PATENT DOCUMENTS

| | | | |
|---|---|---|---|
| 2003/0227361 A1* | 12/2003 | Dickens | H01H 59/0009 335/78 |
| 2011/0049652 A1* | 3/2011 | Wu | B81C 1/00269 257/417 |
| 2012/0248615 A1* | 10/2012 | Chien | B81C 1/0023 257/770 |
| 2014/0054729 A1* | 2/2014 | Kitano | B81B 3/0018 257/415 |
| 2014/0287548 A1 | 9/2014 | Lin et al. | |
| 2014/0374856 A1* | 12/2014 | Chen | B81B 3/0059 257/418 |
| 2015/0137303 A1 | 5/2015 | Chou et al. | |
| 2015/0175405 A1 | 6/2015 | Cheng | |
| 2015/0175407 A1 | 6/2015 | Cheng et al. | |
| 2015/0196912 A1 | 7/2015 | Tsai et al. | |

\* cited by examiner

MEMS STRUCTURE WITH BILAYER STOPPER AND METHOD FOR FORMING THE SAME

BACKGROUND

The semiconductor industry has experienced rapid growth and demands for highly integrated semiconductor devices are increasing. However, the steps taken to meet these demands have increased the complexity of processing and manufacturing semiconductor devices for integrated circuits (ICs) and, for these demands to be met, similar developments in IC processing and manufacturing are needed.

Microelectromechanical systems (MEMS) devices, such as motion sensors, pressure sensors, microphones, accelerometers, and gyroscopes, have found use in many electronic devices. For example, motion sensors, accelerometers, and/or microphones are commonly used in tablet computers, laptop computers, or smartphones. For many applications, MEMS devices are coupled to application-specific integrated circuits (ASICs) to form MEMS packages.

In the foregoing MEMS package, a movable element of the MEMS device is prone to vertical stiction, due to the close proximity of a movable element to a flat surface of the ASIC. Oxide stoppers are typically placed in the MEMS device to prevent the movable element from overextending in the vertical direction. These stoppers typically have a small contact area with the movable element, thereby stopping or mitigating stiction during a shock event in the fabrication or operation of the MEMS package.

Although existing stoppers have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
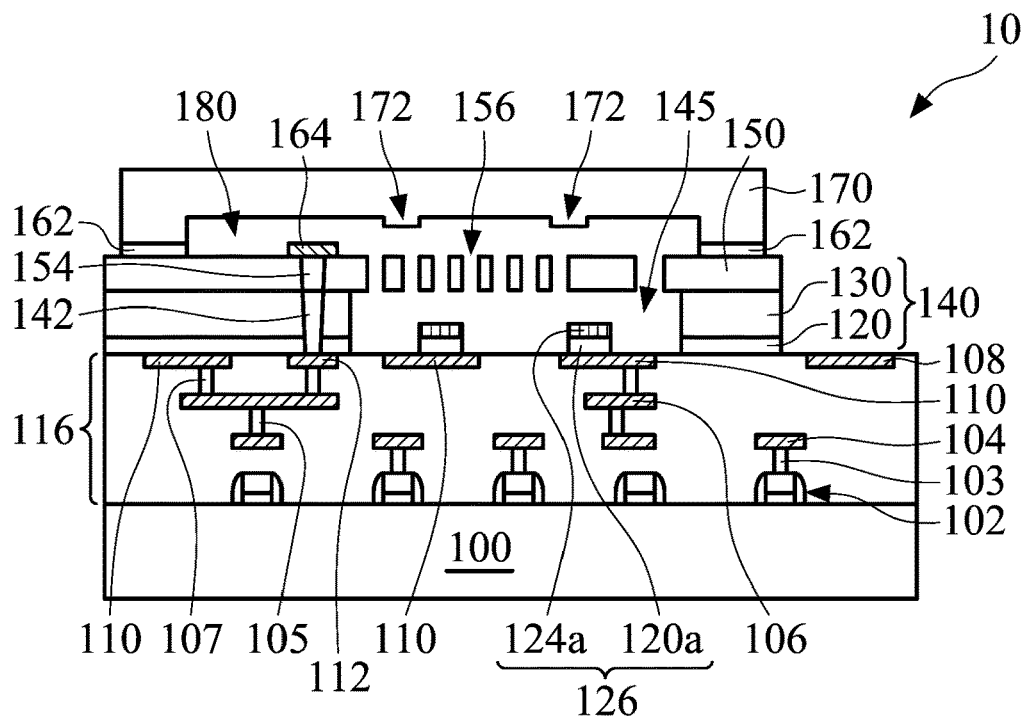
FIG. 1 is a cross-sectional view of a MEMS package with bilayer stoppers, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Microelectromechanical systems (MEMS) devices (e.g., motion sensors, pressure sensors, microphones, accelerometers, and gyroscope) are usually over and bonded to an application-specific integrated circuits (ASICs) chip/die to form MEMS packages. The MEMS device often includes a movable element corresponding to an opening or cavity of the ASIC chip. In one example, the MEMS device is a motion sensor and the movable element is referred to as a proof mass (PM). During fabrication or operation of the MEMS package, the movable element moves in a vertical direction due to an eternal force or an applied voltage. As a result, stiction between the movable element and the underlying ASIC chip may occur, thereby reducing the reliability of the MEMS package or causing the improper operation of the MEMS device.

To overcome such stiction, stoppers (which sometimes are referred to as bumps) may be used and arranged between the bottom surface of the movable element and the top surface of the underlying ASIC chip. In an example, these stoppers are placed on the top surface of the underlying ASIC chip to prevent over-range movement of the movable element along the vertical direction. Moreover, these stoppers are also configured to have a small contact area with the overlying movable element to reduce the chance of stiction.

In some examples, the stoppers are made of oxide. However, charge-induced stiction may be caused because the oxide stoppers easily accumulate charges on surfaces thereof by triboelectricity. Moreover, since the oxide stoppers have high surface energy, Van Der Waals stiction may also be caused by a wet clean process in the fabrication of the movable element of the MEMS device.

Therefore, MEMS packages with improved stoppers (or bumps) and methods for forming the same are provided in accordance with exemplary embodiments. The intermediate stages of forming the MEMS packages in accordance with embodiments are illustrated. The various embodiments are discussed, in which like reference numbers are used to designate like elements.

Some embodiments of the disclosure are described. FIG. 1 is a cross-sectional view of a MEMS package 10 with bilayer stoppers, in accordance with some embodiments. The MEMS package 10 includes an IC structure and a MEMS device structure over and bonded to the IC structure.

In some embodiments, the IC structure, such as an application-specific integrated circuit (ASIC) wafer or chip, serves as a carrier substrate for the MEMS device structure and is employed to control the operation of the MEMS device structure. In some embodiments, the IC structure includes a semiconductor substrate 100 having a metallization layer 116 (which is sometimes referred to as an interconnect layer) over the semiconductor substrate 100. The semiconductor substrate 100 may be made of a semiconductor material, such as silicon, silicon germanium, or the like. In some embodiments, the semiconductor substrate 100 is made of an elementary semiconductor material including silicon or germanium in a single crystal, polycrystal, or amorphous structure. In some other embodiments, the semiconductor substrate 100 is made of a compound semiconductor, such as silicon carbide, gallium arsenide, gallium phosphide, indium phosphide, indium arsenide, an alloy semiconductor, such as SiGe, or GaAsP, or a combination thereof. The semiconductor substrate 100 may also include multi-layer semiconductors, semiconductor on insulator (SOI) (such as silicon on insulator or germanium on insulator), or a combination thereof. A variety of device elements (not shown) may be formed in the semiconductor substrate 100. Such device elements may include active devices (such as transistors) and/or passive devices (such as resistors and/or capacitors).

As shown in FIG. 1, the metallization layer 116 over the semiconductor substrate 100 includes an inter-layer dielectric (ILD) layer and an overlying inter-metal dielectric (IMD) layer, in accordance with some embodiments. In order to simplify the diagram, only a single layer structure is depicted. In some embodiments, active devices (such as transistors) 102 are formed in the metallization layer 116 and on the top of the semiconductor substrate 100.

In some embodiments, the metallization layer 116 also includes various metal features formed in the same or different levels of the metallization layer 116. For example, the metal features may include metal lines 104 (e.g., copper lines) at a first level of the metallization layer 116, metal lines 106 (e.g., copper lines) at a second level (above the first level) of the metallization layer 116, and metal lines 110 (e.g., copper lines) and metal pads 108 and 112 (e.g., copper pads) at a third level (above the second level) of the metallization layer 116 and exposed therefrom. Moreover, the metal features may also include metal vias (e.g., tungsten plugs) 103 electrically connected between the active devices 102 and the metal lines 104, metal vias (e.g., tungsten plugs) 105 electrically connected between the metal lines 104 and the metal lines 106, and metal vias (e.g., tungsten plugs) 107 electrically connected between the metal lines 106 and the metal lines 110 and/or the metal pads 108 or 112.

As shown in FIG. 1, a planarization structure 140 is over the metallization layer, in accordance with some embodiments. In some embodiments, the planarization structure 140 includes a first planarization layer 120 and an overlying second planarization layer 130. The planarization structure 140 has a first cavity 145 and a through hole (which is labeled 143 as indicated in FIG. 4D) therein and passing through the second planarization layer 130 and the underlying first planarization layer 120, so as to expose the metallization layer 116. In some embodiments, the metal lines 110 are exposed from the planarization structure 140 via the first cavity 145 and the metal pad 112 is exposed from the planarization structure 140 via the through hole 143. Moreover, the metal pad 108 is exposed from the planarization structure 140 to serve as a contact for an external circuit (not shown).

In some embodiments, the first planarization layer 120 is an insulating layer. For example, the first planarization layer 120 is made of silicon oxide, silicon nitride, silicon carbide, or silicon oxynitride. In some embodiments, the second planarization layer 130 is also an insulating layer made of a material that is the same as or different from that of the first planarization layer 120. For example, the second planarization layer 130 is made of silicon oxide, silicon nitride, silicon carbide, or silicon oxynitride. In some embodiments, the second planarization layer 130 has a thickness greater than that of the first planarization layer 120. In these cases, a conductive through via 142 (which is sometimes referred to as through insulator via (TIV)) fills the through hole 143 and is electrically connected to the metal pad 112.

As shown in FIG. 1, a MEMS device structure is over and bonded to the second planarization layer 130 of the planarization structure 140, in accordance with some embodiments. In some embodiments, the MEMS device structure is a motion sensor structure and includes a device substrate 150 bonded to the planarization structure 140. In these cases, the device substrate 150 includes a moveable element 156 (e.g., a proof mass (PM)) over and corresponding to the first cavity 145. The device substrate 150 also includes a fixed portion surrounding the moveable element 156 and is fixed onto the planarization structure 140 to support the moveable element 156. In some embodiments, device substrate 150 includes a through hole (which is labeled 153 as indicated in FIG. 4E) therein and passing through the device substrate 150. In these cases, the through hole 153 is substantially aligned with the through hole 143 and a conductive through via 154 (such as a TIV) fills the through hole 153 and is electrically connected to the metal pad 112 via the conductive through via 142. In alternative embodiments, a single-layer conductive through via may be used instead of the conductive through vias 154 and 142.

In some embodiments, the MEMS device structure includes a bonding layer 162 and a metal pad 164 over the fixed portion of the device substrate 150. For example, the bonding layer 162 may surround the moveable element 156 to provide a mounting region. Moreover, the MEMS device structure includes a metal pad 164 over the fixed portion of the device substrate 150. For example, the metal pad 164 may be electrically connected to the conductive through via 154, such that the moveable element 156 is controlled by the underlying IC structure via the metal pads 112 and 164 and the conductive through vias 142 and 154 therebetween.

As shown in FIG. 1, one or more first stoppers 126 are placed on the exposed metallization layer 116 in the first cavity 145, in accordance with some embodiments. In some embodiments, first stoppers 126 are arranged in the bottom of the first cavity 145 and integrated with the planarization structure 140. For example, each of the first stoppers 126 may include a patterned conductive layer 124a facing the movable element 156 and a patterned insulating layer 120a under the patterned conductive layer 124a to form a bilayer stopper. In some embodiments, the first stoppers 126 are arranged directly above the corresponding metal features (e.g., metal lines 110). In alternative embodiments, the first stoppers 126 are arranged so that they are not aligned with any metal features. In alternative embodiments, some of the first stoppers 126 are aligned with metal features and others are not aligned with any metal features. In an example, two first stoppers 126 are arranged directly above the corresponding metal lines 110, respectively, as shown in FIG. 1.

In some embodiments, the patterned conductive layer 124a is made of a metal (e.g., Ti, Al, Cu, or an alloy thereof), metal nitride (e.g., TiN), or a conductive polymer (e.g., a conductive polyimide). In some embodiments, the patterned insulating layer 120a has a hardness that is greater than that of the patterned conductive layer 124a. Moreover, the patterned insulating layer 120a is made of the same material layer as the first planarization layer 120 (which is made of, for example, silicon oxide, silicon nitride, silicon carbide, or silicon oxynitride). The first stoppers 126 prevent over-range movement of the movable element 156 and stop the movable element 156 from sticking to the IC structure during a shock event. In some embodiments, the patterned conductive layer 124a with a relatively low hardness serves as a buffer layer to protect the patterned insulating layer 120a with a relatively high hardness from damage by the movable element 156, thereby increasing the reliability and strength of the first stoppers 126. Moreover, the patterned conductive layer 124a of the first stopper 126 may eliminate or mitigate charge accumulation compared to oxide stoppers. Additionally, the patterned conductive layer 124a of the first stopper 126 has a relatively low surface energy, and therefore Van Der Waals stiction caused by a wet clean process in the fabrication of the movable element 156 of the MEMS device structure can be prevented.

As shown in FIG. 1, a cap layer 170 over the MEMS device structure, in accordance with some embodiments. In some embodiments, the cap layer 170 includes a base portion and an extending portion protruding from the peripheral region of the base portion. The extending portion surrounds a central region of the base portion to define a second cavity 180 over the moveable element 156. In some embodiments, the cap layer 170 includes third stoppers 172 integrated with the base portion of the cap layer 170. For example, the third stopper 172 may protrude from a surface of the base portion of the cap layer 170 (i.e., a bottom of the second cavity 180), thereby facing the moveable element 156. The third stoppers 172 may or may not be aligned with the first stoppers 126. In some embodiments, the third stoppers 172 also prevent over-range movement of the movable element 156 and stop the movable element 156 from sticking to the cap layer 170.

In some embodiments, the extending portion of the cap layer 170 is bonded to the MEMS device structure via the bonding layer 162, such that the cap layer 170 substantially covers the entire top surface of the MEMS structure.

Figure 2:
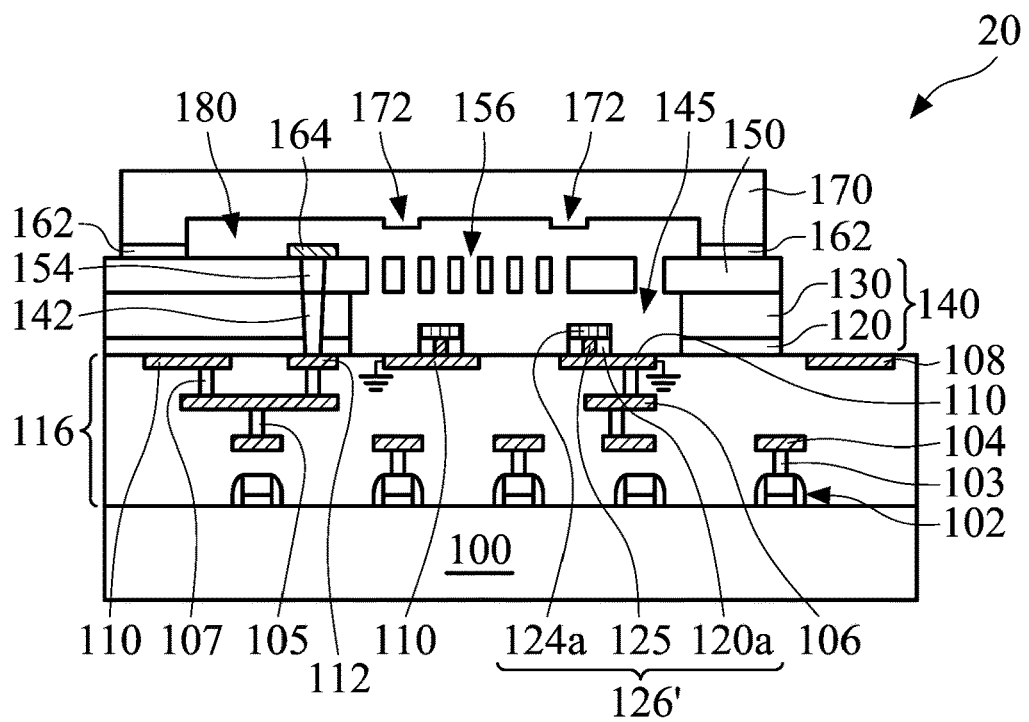
FIG. 2 is a cross-sectional view of a MEMS package with bilayer stoppers, in accordance with some embodiments.

FIG. 2 is a cross-sectional view of a MEMS package 20 with bilayer stoppers, in accordance with some embodiments. As shown in FIG. 2, the MEMS package 20 includes a similar structure to the MEMS package 10 shown in FIG. 1. In some embodiments, however, each of the first stoppers 126' in the MEMS package 20 includes a patterned conductive layer 124a facing the movable element 156, a patterned insulating layer 120a under the patterned conductive layer 124a, and a conductive connector 125 in the patterned insulating layer 120a. Some of the metal features (such as metal lines 110) in the metallization layer 116 may be arranged below a bottom of the first cavity 145 and directly under the respective first stoppers 126', such that the patterned conductive layer 124a of each first stopper 126' is electrically connected to the corresponding metal feature (i.e., the metal line 110) through the conductive connector 125. In some embodiments, these metal features (i.e., the metal lines 110) directly under the respective first stoppers 126' are electrically connected to ground, as shown in FIG. 2. As a result, charges accumulated on the first stoppers 126', if present, can be released via a conductive path created by the patterned conductive layer 124a, the corresponding conductive connector 125, and the grounded corresponding metal feature (i.e., the metal line 110). In some embodiments, these metal features (i.e., the metal lines 110) directly under the respective first stoppers 126' are electrically connected to the metal pad 112 (not shown). In these cases, the metal pad 112 may be coupled to an electric potential, such that the patterned conductive layer 124a and the movable element 156 are coupled to the same electric potential via the metal pad 112, the conductive through vias 142 and 154, and the metal pad 164.

In some embodiments, the conductive connector 125 is a conductive via and is made of a material layer that is employed to form the patterned conductive layer 124a. In alternative embodiments, the conductive connector 125 is a conductive via and is made of a different material than the patterned conductive layer 124a.

Figure 3:
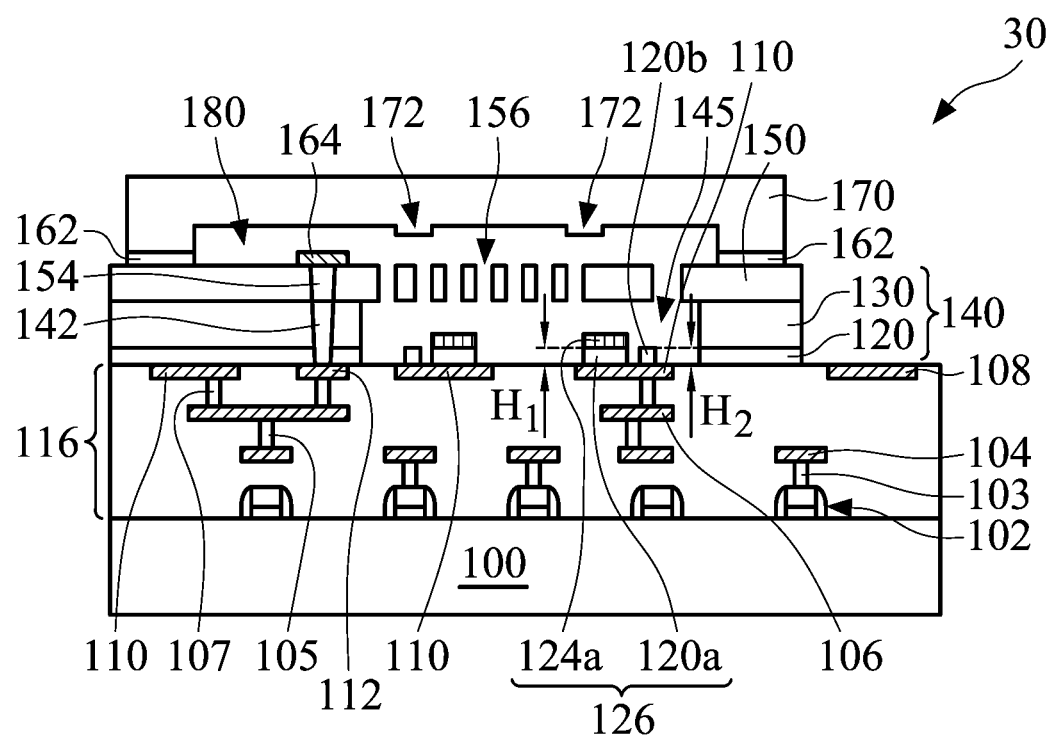
FIG. 3 is a cross-sectional view of a MEMS package with bilayer stoppers, in accordance with some embodiments.

FIG. 3 is a cross-sectional view of a MEMS package 30 with bilayer stoppers, in accordance with some embodiments. As shown in FIG. 3, the MEMS package 30 includes a similar structure to the MEMS package 10 shown in FIG. 1. In some embodiments, however, the MEMS package 30 includes second stoppers placed on the exposed metallization layer 116 in the first cavity 145 and adjacent to the respective first stoppers 126.

In some embodiments, the first stoppers 126 have a height greater than that of the second stoppers 120b. For example, the second stoppers 120b, the patterned insulating layers 120a of the first stoppers 126 is made of the same material layer as the first planarization layer 120. Namely, this material layer is employed to define the second stoppers 120b, the patterned insulating layers 120a of the first stoppers 126, and the first planarization layer 120. In these cases, each of the second stoppers 120b has a height H2 substantially equal to a height H1 of the patterned insulating layer 120a of the first stopper 126. The additional second stoppers 120b help the first stoppers 126 to withstand a colliding force from the movable element 156 during a shock event.

In alternative embodiments, the first stoppers 126 have a height greater than that of the second stoppers 120b. However, each of the second stoppers 120b is made of material layers that are the same as the first planarization layer 120 and the second planarization layer 130. Namely, these materials layer are employed to form the second stoppers 120b, the first planarization layer 120, and the second planarization layer 130. In these cases, the second stopper 120b may have a height greater than that of the patterned insulating layer 120a of the first stopper 126.

In alternative embodiments, the first stoppers 126' shown in FIG. 2 are used instead of the first stoppers 126 in the MEMS package 30. In these cases, some of the metal features (such as metal lines 110) in the metallization layer 116 may be arranged below a bottom of the first cavity 145 and directly under the respective first stoppers 126', such that the patterned conductive layer 124a of each first stopper 126' is electrically connected to the corresponding metal feature (i.e., the metal line 110) through the conductive connector 125. In these cases, these metal features (i.e., the metal lines 110) directly under the respective first stoppers 126' are electrically connected to ground. In yet alternative embodiments, these metal features (i.e., the metal lines 110) directly under the respective first stoppers 126' are electrically connected to the metal pad 112. In these cases, the metal pad 112 may be coupled to an electric potential, such that the patterned conductive layer 124a and the movable element 156 are coupled to the same electric potential via the metal pad 112, the conductive through vias 142 and 154, and the metal pad 164.

FIGS. 4A to 4G are cross-sectional views of various stages of a method of forming the MEMS package 10 shown in FIG. 1, in accordance with some embodiments. Additional operations can be provided before, during, and/or after the stages described in FIGS. 4A to 4G. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Figure 4A:
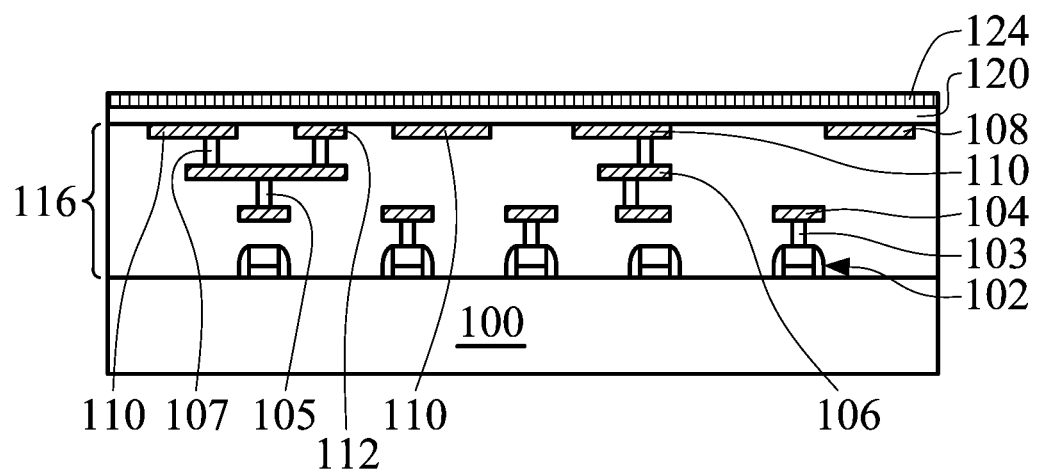
FIGS. 4A to 4G are cross-sectional views of various stages of a method of forming the MEMS package shown in FIG. 1, in accordance with some embodiments.

As shown in FIG. 4A, an IC structure (such as an ASIC wafer or chip) is provided, in accordance with some embodiments. The IC structure may serve as a carrier substrate for the MEMS device structure and is employed to control the operation of the MEMS device structure. In some embodiments, the IC structure includes a semiconductor substrate 100 having a metallization layer 116 over the semiconductor substrate 100 and is formed by a complementary metal-oxide-semiconductor (CMOS) process. The semiconductor substrate 100 may be made of silicon, silicon germanium, or the like. In some embodiments, the semiconductor substrate 100 is made of an elementary semiconductor material including silicon or germanium in a single crystal, polycrystal, or amorphous structure. In some other embodiments, the semiconductor substrate 100 is made of a compound semiconductor, such as silicon carbide, gallium arsenide, gallium phosphide, indium phosphide, indium arsenide, an alloy semiconductor, such as SiGe, or GaAsP, or a combination thereof. The semiconductor substrate 100 may also include multi-layer semiconductors, semiconductor on insulator (SOI) (such as silicon on insulator or germanium on insulator), or a combination thereof. A variety of device elements (not shown), such as transistors, resistors or capacitors, are formed in the semiconductor substrate 100.

In some embodiments, the metallization layer 116 includes an ILD layer and an overlying IMD layer, in accordance with some embodiments. In order to simplify the diagram, only a single layer structure is depicted. The ILD and IMD layers may be made of a dielectric material including silicon oxide, borosilicate glass (BSG), phosphoric silicate glass (PSG), borophosphosilicate glass (BPSG), fluorinated silicate glass (FSG), tetraethyl orthosilicate (TEOS) oxide, or a combination thereof, for example. Alternatively, the ILD and IMD layers may include a low-k dielectric material or a porous dielectric material having a low k value (dielectric constant). The k value of the low-k dielectric material or porous dielectric material may be lower than about 3.0, or lower than about 2.5, for example.

In some embodiments, the ILD and IMD layers are formed by a spin-on process, a chemical vapor deposition (CVD) process (such as a low-pressure CVD (LPCVD) process, a plasma-enhanced CVD (PECVD) process, or a high-density plasma CVD (HDPCVD) process), or another suitable method.

In some embodiments, active devices (such as transistors) 102 are formed in the metallization layer 116 and on the top of the semiconductor substrate 100. The metallization layer 116 also includes various metal features formed therein. For example, the metal features may include metal lines 104 (e.g., copper lines) at a first level of the metallization layer 116, metal lines 106 (e.g., copper lines) at a second level (above the first level) of the metallization layer 116, and metal lines 110 (e.g., copper lines) and metal pads 108 and 112 (e.g., copper pads) at a third level (above the second level) of the metallization layer 116. Moreover, the metal features may also include metal vias (e.g., tungsten plugs) 103 electrically connected between the active devices 102 and the metal lines 104, metal vias (e.g., tungsten plugs) 105 electrically connected between the metal lines 104 and the metal lines 106, and metal vias (e.g., tungsten plugs) 107 electrically connected between the metal lines 106 and the metal lines 110 and/or the metal pads 108 or 112.

As shown in FIG. 4A, a first planarization layer 120 and a conductive layer 124 are successively formed over the metallization layer 116, in accordance with some embodiments. In some embodiments, the first planarization layer 120 and the conductive layer 124 are employed to define bilayer stoppers. For example, the first planarization layer 120 may be made of an insulating material including silicon oxide, silicon nitride, silicon carbide, or silicon oxynitride. In these cases, the first planarization layer 120 may be formed by a CVD process (such as an LPCVD process, a PECVD process, or an HDPCVD process), or another suitable method. Moreover, the conductive layer 124 may be made of a metal (e.g., Ti, Al, Cu, or an alloy thereof), metal nitride (e.g., TiN), or a conductive polymer (e.g., a conductive polyimide). In these cases, the conductive layer 124 may be formed by a physical vapor deposition (PVD) process (such as radio frequency PVD (RFPVD)), an atomic layer deposition (ALD) process, a CVD process, or another suitable method. In some embodiments, the first planarization layer 120 has a hardness that is greater than that of the conductive layer 124.

Figure 4B:
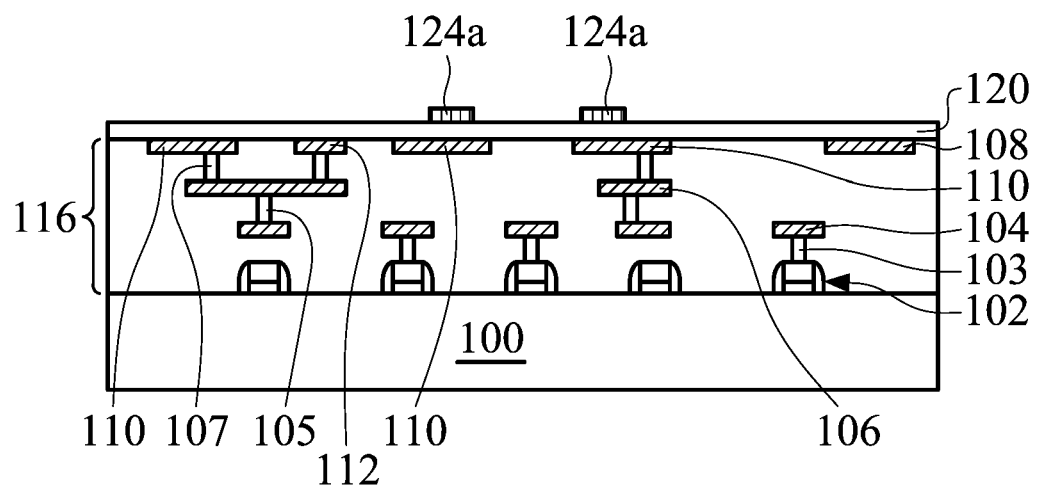

As shown in FIG. 4B, patterned conductive layers 124a are formed over the first planarization layer 120, in accordance with some embodiments. In some embodiments, the conductive layer 124 is etched by, for example, a dry etching process, to form the patterned conductive layers 124a. For example, two patterned conductive layers 124a are formed on the first planarization layer 120 and directly over the respective metal lines 110. Alternatively, the two patterned conductive layers 124a may not be directly over the respective metal lines 110.

Figure 4C:
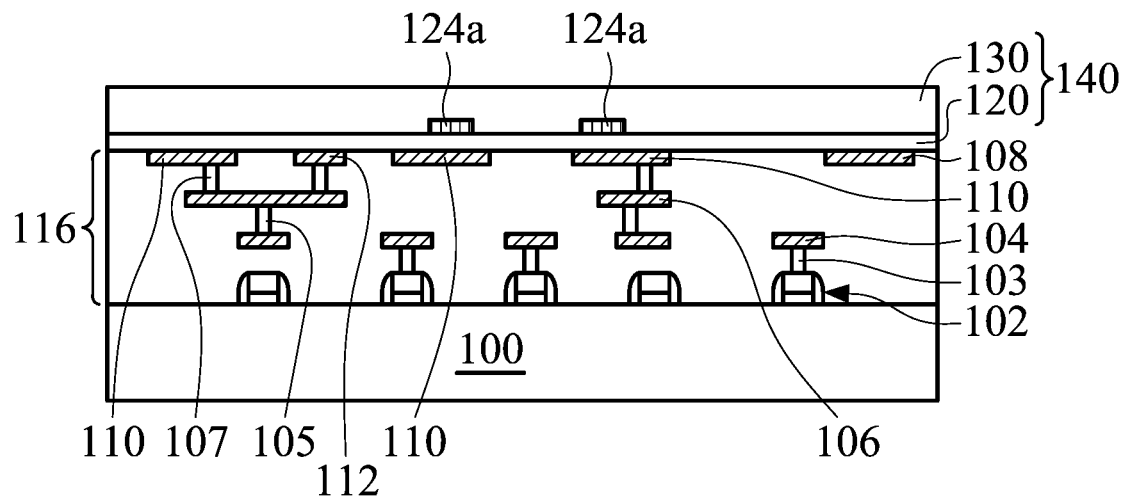
Figure 4D:
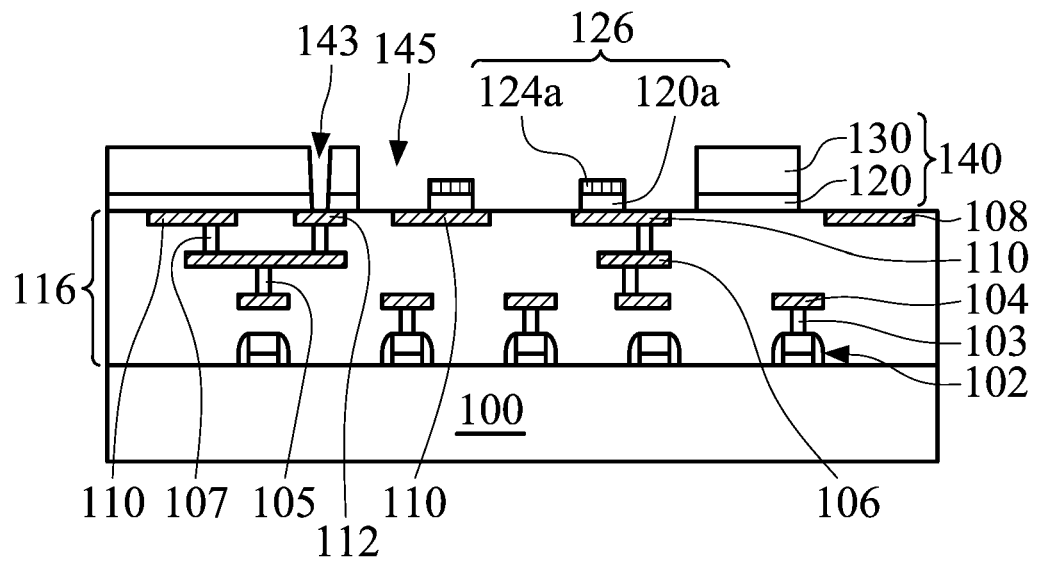
Figure 4E:
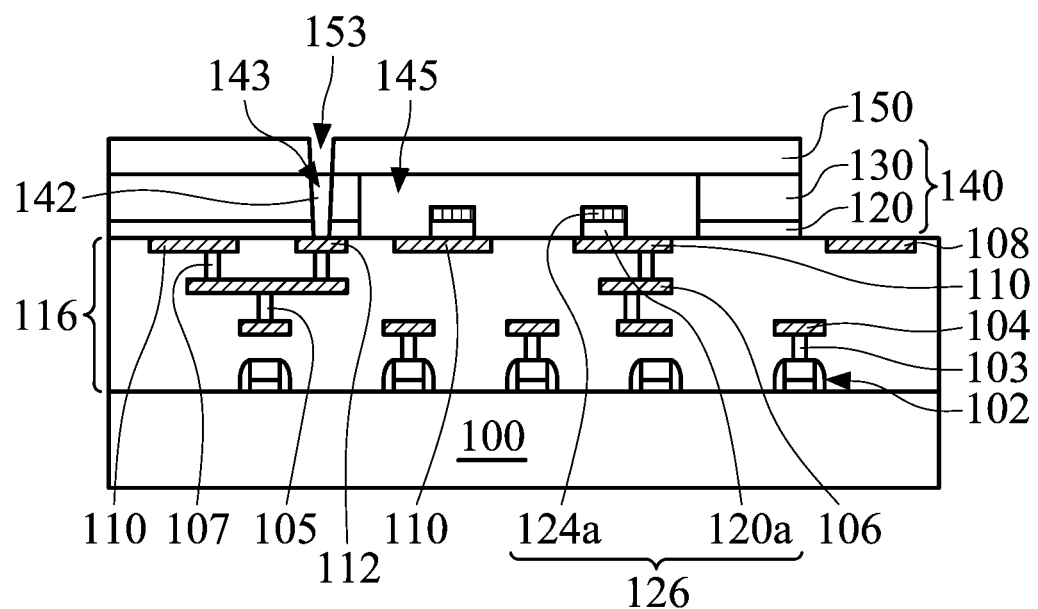

As shown in FIG. 4C, a second planarization layer 130 is formed over the first planarization layer 120, in accordance with some embodiments. In some embodiments, the second planarization layer 130 is formed over the first planarization layer and entirely covers the patterned conductive layers 124a. The first planarization layer 120 and the second planarization layer 130 constitute a planarization structure 140. In some embodiments, the second planarization layer 130 is made of an insulating material that is the same as or different from that of the first planarization layer 120. For example, the second planarization layer 130 is made of silicon oxide, silicon nitride, silicon carbide, or silicon oxynitride. In some embodiments, the second planarization layer 130 has a thickness greater than that of the first planarization layer 120.

As shown in FIG. 4D, the planarization structure 140 is patterned, in accordance with some embodiments. In some embodiments, the second planarization layer 130 and the first planarization layer 120 are successively recessed by an etching process, such as dry etching process, to expose the metal pad 108 and form a through hole 143 and a first cavity 145 that expose the metal pad 112 and the metal lines 110 of the metallization layer 116, respectively. During the etching process, the patterned conductive layers 124a serve as etch masks, so as to form first stoppers 126 on the exposed metallization layer 116 in the first cavity 145 after the etching process. In these cases, each of the formed first stoppers 126 includes the patterned conductive layer 124a and an underlying patterned insulating layer 120a that is formed by the recessing of the first planarization layer 120.

As shown in FIG. 4E, a conductive through via 142 (which is sometimes referred to as TIV) fills the through hole 143 to be electrically connected to the metal pad 112. In some embodiments, the conductive through via 142 is made of metal. The formation method of the conductive through via 142 includes a PVD process, an ALD process, a CVD process, or another suitable method.

Figure 4F:
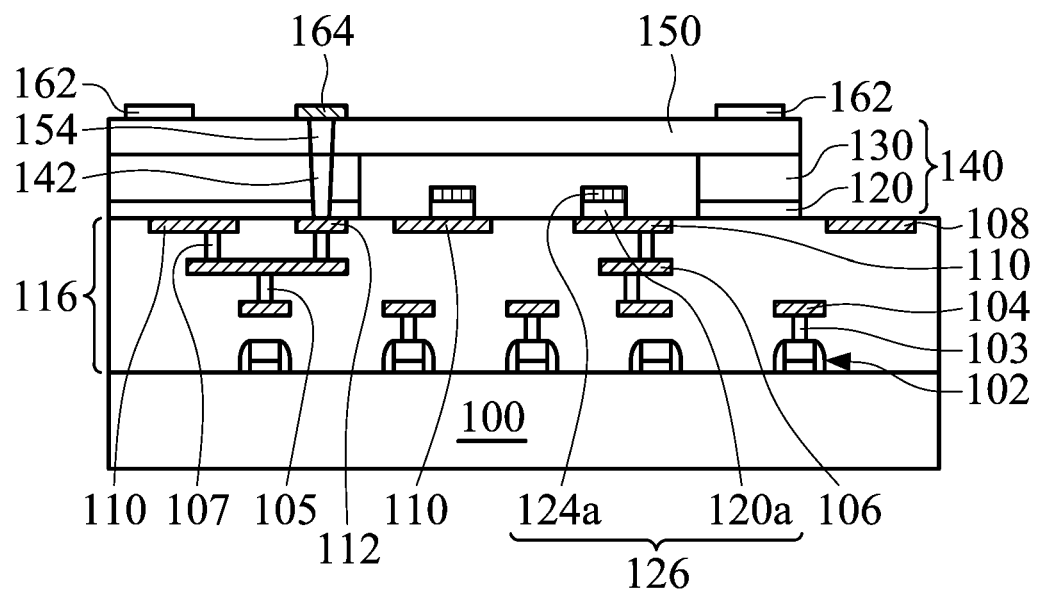
Figure 4G:
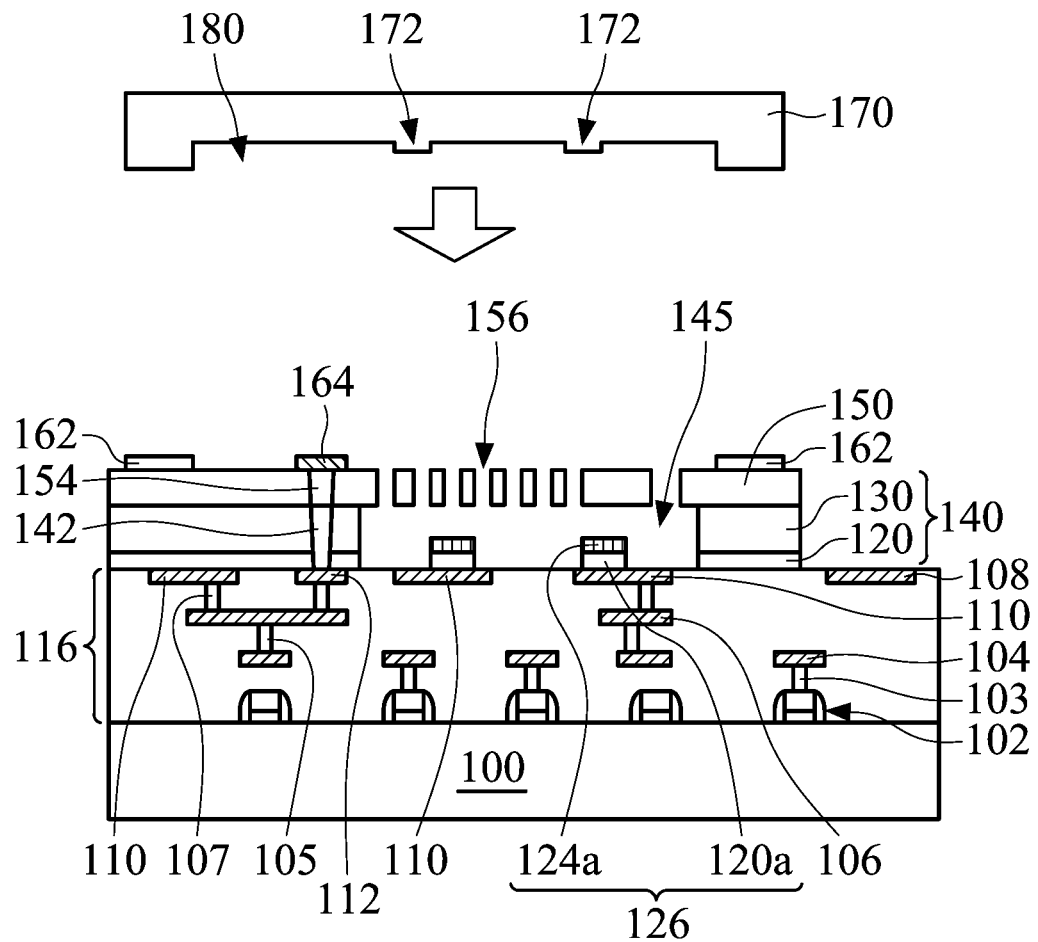

Afterwards, a MEMS device structure (such as a motion sensor structure) is formed over the planarization structure 140 including the first and second planarization layers 120 and 130, in accordance with some embodiments, as shown in FIGS. 4E to 4G. In FIG. 4E, a device substrate 150 is provided and bonded to the planarization structure 140 to cover the through hole 143 and the first cavity 145, in accordance with some embodiments. In these cases, the device substrate 150 may be a silicon substrate including MEMS devices, features and/or functionalities. In some embodiments, the device substrate 150 is made of another elementary semiconductor, such as germanium (Ge). Alternatively, the device substrate 150 may also include a compound semiconductor, such as silicon carbide, gallium arsenic, indium arsenide, indium phosphide, or the like.

In some embodiments, a through hole 153 is formed in the device substrate 150 by an etching process (such as a dry etching process). The through hole 153 is substantially aligned with the through hole 143, so as to expose the conductive through via 142.

As shown in FIG. 4F, a conductive through via 154, a bonding layer 162, and a metal pad 164 are formed, in accordance with some embodiments. In some embodiments, the conductive through via 154 (such as a TIV)) fills the through hole 153 and is electrically connected to the metal pad 112 via the conductive through via 142. In alternative embodiments, a single-layer conductive through via may be used instead of the conductive through vias 154 and 142 to fill the through holes 143 and 153.

In some embodiments, the bonding layer 162, and a metal pad 164 are formed over the device substrate 150. For example, the metal pad 164 may be formed by patterning a metal layer (not shown) formed on the device substrate 150 and is electrically connected to the metal pad 112 via the conductive through vias 154 and 142. Moreover, the bonding layer 162 may be formed by patterning a eutectic material layer (not shown) formed on the device substrate 150. For example, the eutectic material layer is made of germanium, aluminum, copper, titanium, nickel, silver, gold, indium, tin or silicon. In alternative embodiments, the bonding layer 162 is formed of a non-eutectic material.

As shown in FIG. 4G, a moveable element 156 is formed, in accordance with some embodiments. In some embodiments, the device substrate 150 is etched by a dry etching process, so as to define a moveable element 156 (e.g., a proof mass (PM)) over and corresponding to the first cavity 145 and a fixed portion surrounding the moveable element 156. The fixed portion is fixed onto the planarization structure 140 to support the moveable element 156. In these cases, the bonding layer 162 may be over the fixed portion and surround the moveable element 156 to provide a mounting region for the subsequently formed cap layer. Moreover, the metal pad 164 may be over the fixed portion of the device substrate 150 and the moveable element 156 is controlled by the underlying IC structure via the metal pads 112 and 164 and the conductive through vias 142 and 154 therebetween.

As shown in FIG. 4G, a cap layer 170 is formed over and bonded to the MEMS device structure, in accordance with some embodiments. In some embodiments, the cap layer 170 includes a base portion and an extending portion protruding from the peripheral region of the base portion. The extending portion surrounds a central region of the base portion to define a second cavity 180 over the moveable element 156. In some embodiments, the cap layer 170 includes third stoppers 172 integrated with the base portion of the cap layer 170. For example, the third stopper 172 may protrude from a surface of the base portion of the cap layer 170 (i.e., a bottom of the second cavity 180), thereby facing the moveable element 156. The third stoppers 172 may or may not be aligned with the first stoppers 126, respectively.

In some embodiments, the extending portion of the cap layer 170 includes a bonding layer (not shown) that is bonded to the MEMS device structure via the bonding layer 162, such that the cap layer 170 substantially covers the entire top surface of the MEMS structure. As a result, the MEMS package 10 is formed, as shown in FIG. 1.

In some embodiments, the bonding layer of the cap layer is made of a material that is the same as or similar to that of the bonding layer 162, such that the cap layer 170 is bonded to the MEMS device structure by a eutectic bonding process. In some embodiments, the cap layer 170 is made of silicon or another elementary semiconductor. In some embodiments, the cap layer 170 is made of silicon carbide, gallium arsenic, indium arsenide, indium phosphide, or another applicable material.

FIGS. 5A to 5H are cross-sectional views of various stages of a method of forming the MEMS package 20 shown in FIG. 2, in accordance with some embodiments. In some embodiments, the MEMS package 20 shown in FIG. 2 includes a similar structure to that shown in FIG. 1 and is formed using a method that is the same as or similar to the method shown in FIGS. 4A to 4G.

Figure 5A:
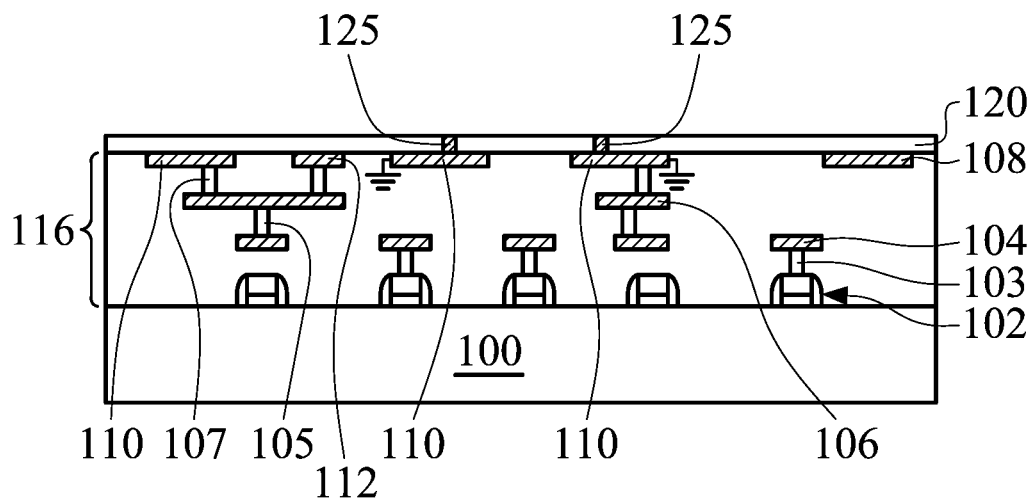
FIGS. 5A to 5H are cross-sectional views of various stages of a method of forming the MEMS package shown in FIG. 2, in accordance with some embodiments.

As shown in FIG. 5A, an IC structure (such as an ASIC wafer or chip) is provided, in accordance with some embodiments. In some embodiments, the IC structure includes a semiconductor substrate 100 and an overlying metallization layer 116 that are shown in FIG. 4A. In some embodiments, a first planarization layer 120 is formed over the metallization layer 116 by the method shown in FIG. 4A. Afterwards, openings are formed in the first planarization layer 120 to expose the metal features (such as metal lines 110), respectively.

As shown in FIG. 5A, conductive connectors 125 are formed in the openings of the first planarization layer 120, in accordance with some embodiments. The conductive connectors 125 are electrically connected to the respective metal lines 110. In these cases, these metal lines 110 connected to the conductive connectors 125 may be electrically connected to ground. In alternative embodiments, the metal lines 110 electrically connected to the conductive connectors 125 are electrically connected to the metal pad 112. In these cases, the metal pad 112 may be coupled to an electric potential. In some embodiments, the conductive connector 125 serves as a conductive via and is made of metal, such as copper, tungsten, or another suitable metal via material. In these cases, the conductive connectors 125 may be formed by a damascene process or another suitable metal deposition process.

Figure 5B:
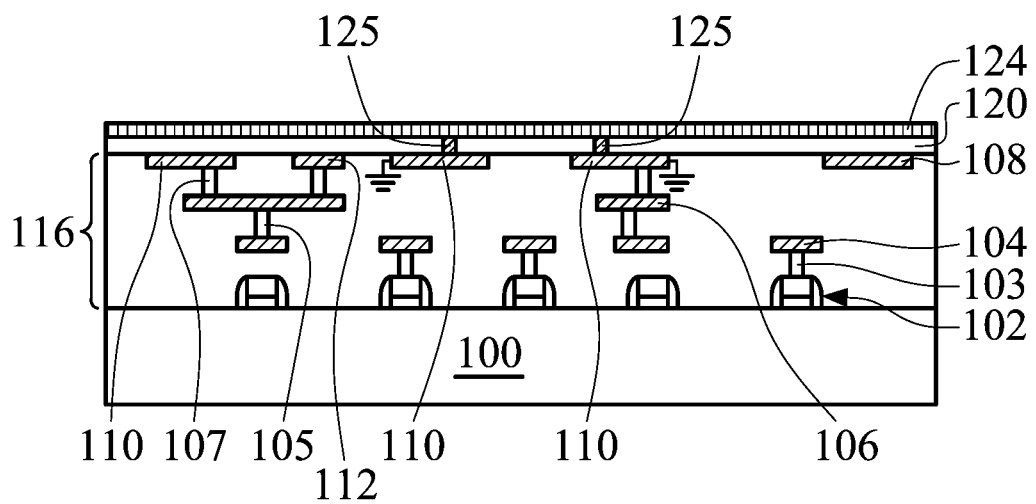

As shown in FIG. 5B, a conductive layer 124 is formed over the first planarization layer 120 with conductive connectors 125 by the method shown in FIG. 4A, in accordance with some embodiments.

Figure 5C:
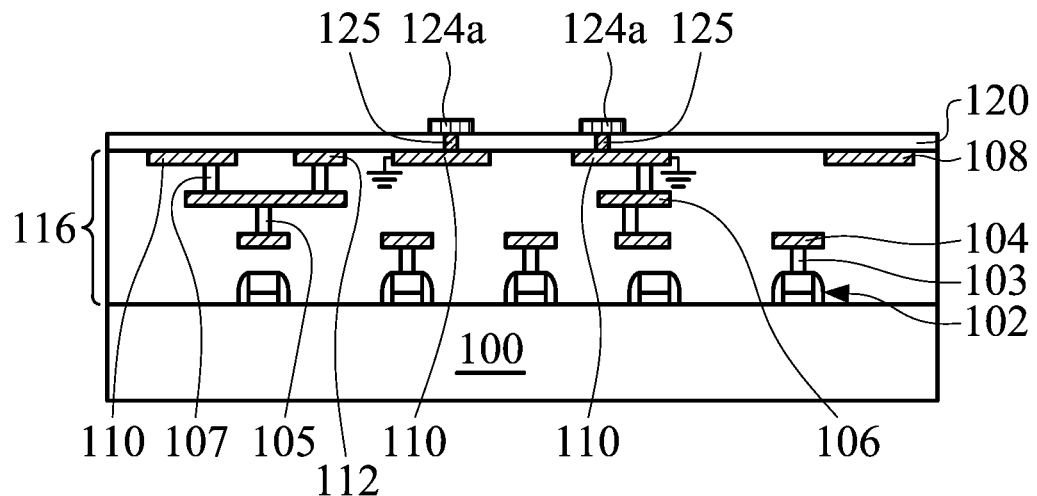

As shown in FIG. 5C, patterned conductive layers 124a are formed over the first planarization layer 120 by the method shown in FIG. 4B, in accordance with some embodiments. Each of the patterned conductive layers 124a is electrically connected to the corresponding metal feature (i.e., the metal line 110) through the conductive connector 125. In some embodiments, the conductive connectors 125 are made of a different material than the patterned conductive layer 124a. In alternative embodiments, the conductive connectors 125 are made of a material layer that is employed to form the conductive layer 124.

Figure 5D:
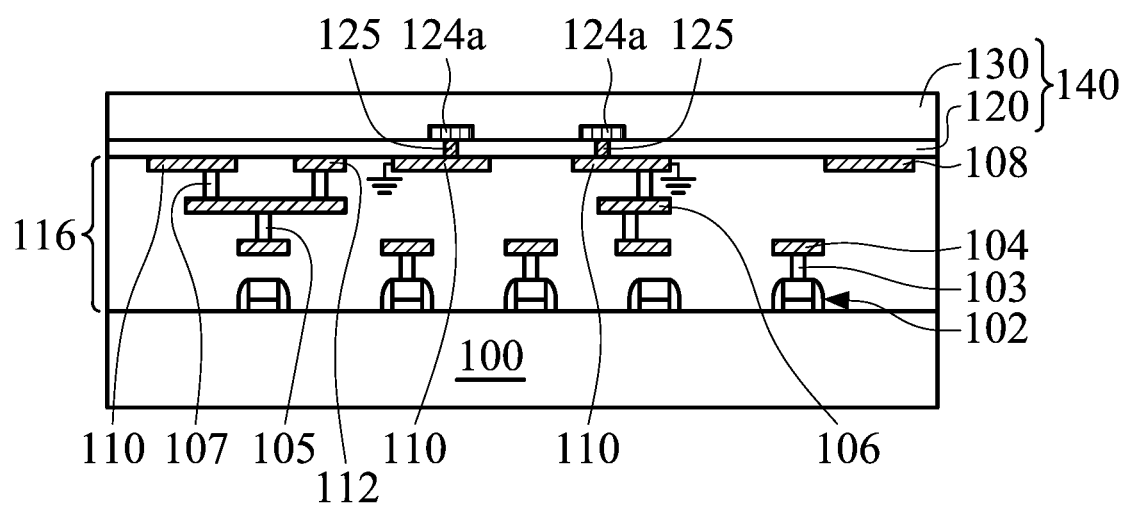

As shown in FIG. 5D, a second planarization layer 130 is formed over the first planarization layer 120 by the method shown in FIG. 4C, in accordance with some embodiments. In some embodiments, the second planarization layer 130 entirely covers the patterned conductive layers 124a. The first planarization layer 120 and the second planarization layer 130 constitute a planarization structure 140.

Figure 5E:
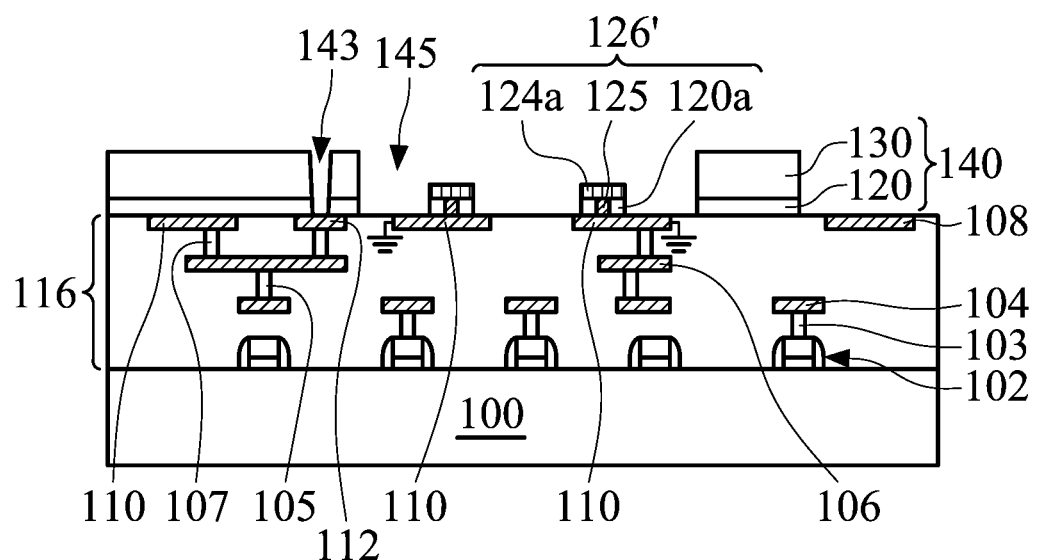

As shown in FIG. 5E, the planarization structure 140 is patterned by the method shown in FIG. 4D, in accordance with some embodiments. As a result, the metal pad 108 is exposed. Moreover, a through hole 143 and a first cavity 145 are formed, so as to expose the metal pad 112 and the metal lines 110 of the metallization layer 116, respectively. Moreover, first stoppers 126' are formed on the exposed metallization layer 116 in the first cavity 145 after the planarization structure 140 is patterned. Each of the formed first stoppers 126' includes the patterned conductive layer 124a, a patterned insulating layer 120a under the patterned conductive layer 124a, and a conductive connector 125 in the patterned insulating layer 120a. The patterned conductive layer 124a of each first stopper 126' is electrically connected to the corresponding metal feature (i.e., the metal line 110) through the conductive connector 125.

Figure 5F:
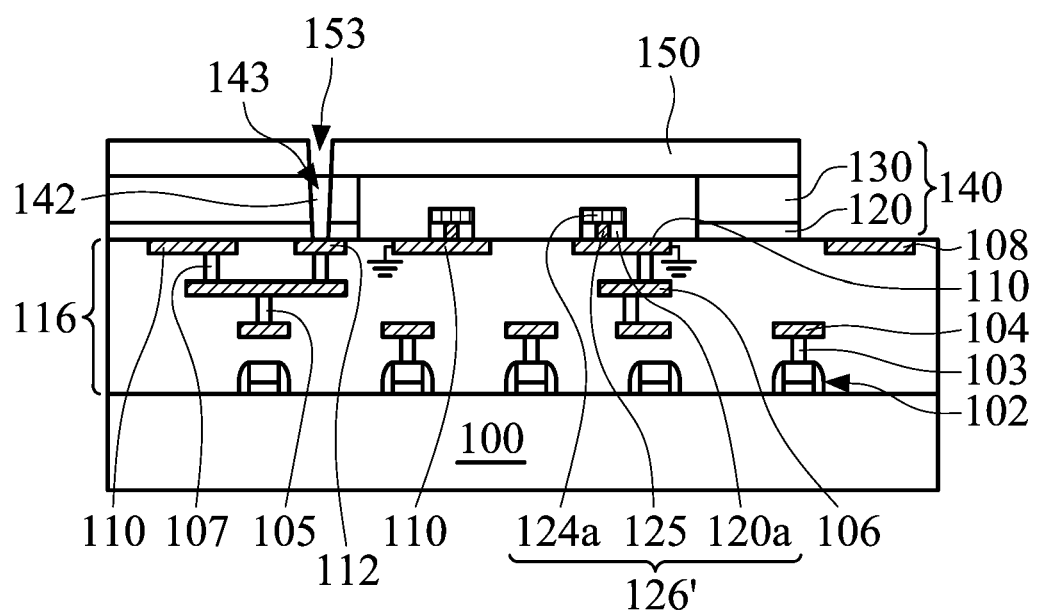
Figure 5G:
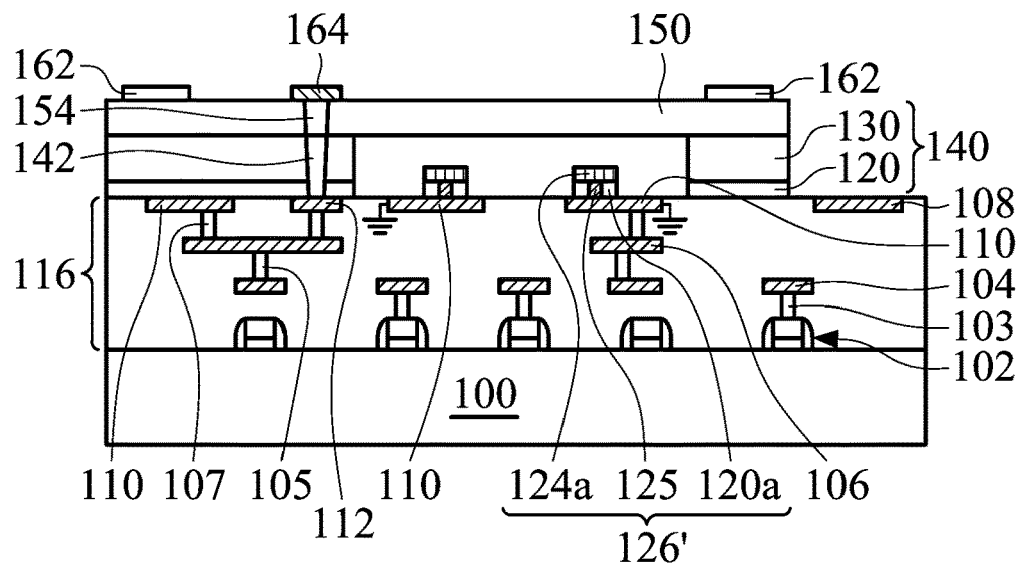
Figure 5H:
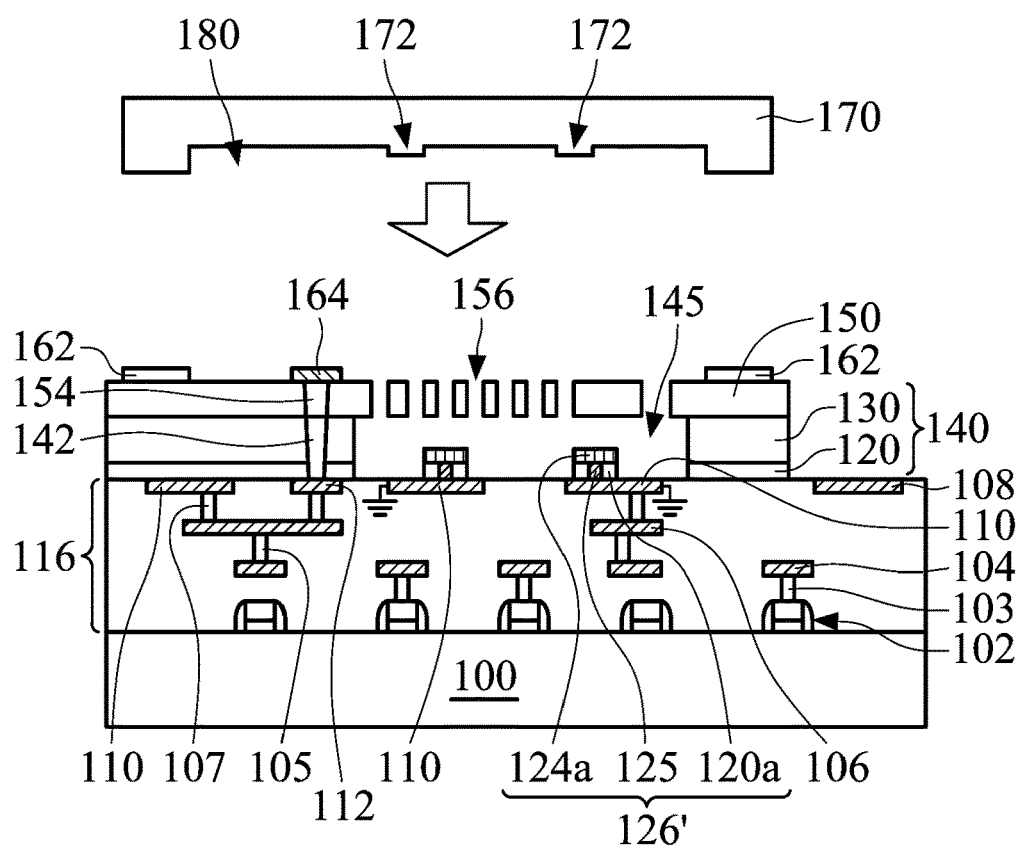

As shown in FIG. 5F, a conductive through via 142 (which is sometimes referred to as TIV) fills the through hole 143 by the method shown in FIG. 4E, so as to be electrically connected to the metal pad 112. Afterwards, a MEMS device structure (such as a motion sensor structure) is formed over the planarization structure 140 including the first and second planarization layers 120 and 130, in accordance with some embodiments, as shown in FIGS. 5F to 5H. In FIG. 5F, a device substrate 150 with a through hole 153 exposing the conductive through via 142 is provided and bonded to the planarization structure 140 by the method shown in FIG. 4E.

As shown in FIG. 5G, a conductive through via 154, a bonding layer 162, and a metal pad 164 are formed by the method shown in FIG. 4F, in accordance with some embodiments. The conductive through via 154 (such as a TIV)) fills the through hole 153 and is electrically connected to the metal pad 112 via the conductive through via 142. In some embodiments, a single-layer conductive through via may be used instead of the conductive through vias 154 and 142 to fill the through holes 143 and 153.

As shown in FIG. 5H, a device substrate 150 that includes a moveable element 156 surrounded by a fixed portion is formed by the method shown in FIG. 4G, in accordance with some embodiments. The moveable element 156 is over and corresponding to the first cavity 145 and a fixed portion surrounding the moveable element 156. The fixed portion is fixed onto the planarization structure 140 to support the moveable element 156. Moreover, the metal pad 164 may be over the fixed portion of the device substrate 150 and the moveable element 156 is controlled by the underlying IC structure via the metal pads 112 and 164 and the conductive through vias 142 and 154 therebetween. In some embodiments, the metal lines 110 electrically connected to the conductive connectors 125 are not electrically connected to ground, but are electrically connected to the metal pad 112 that is coupled to an electric potential, such that the patterned conductive layer 124a and the movable element 156 are coupled to the same electric potential via the metal pad 112, the conductive through vias 142 and 154, and the metal pad 164.

As shown in FIG. 5H, a cap layer 170 is formed over and bonded to the MEMS device structure by the method shown in FIG. 4G, in accordance with some embodiments. In some embodiments, the cap layer 170 includes a second cavity 180 over the moveable element 156. In some embodiments, the cap layer 170 includes third stoppers 172 integrated with the cap layer 170 and facing the moveable element 156. In some embodiments, the third stoppers 172 may or may not be aligned with the first stoppers 126, respectively. As a result, the MEMS package 20 is formed, as shown in FIG. 2.

FIGS. 6A to 6F are cross-sectional views of various stages of a method of forming the MEMS package 30 shown in FIG. 3, in accordance with some embodiments. In some embodiments, the MEMS package 30 shown in FIG. 3 includes a similar structure to that shown in FIG. 1 and is formed using a method that is the same as or similar to the method shown in FIGS. 4A to 4G.

Figure 6A:
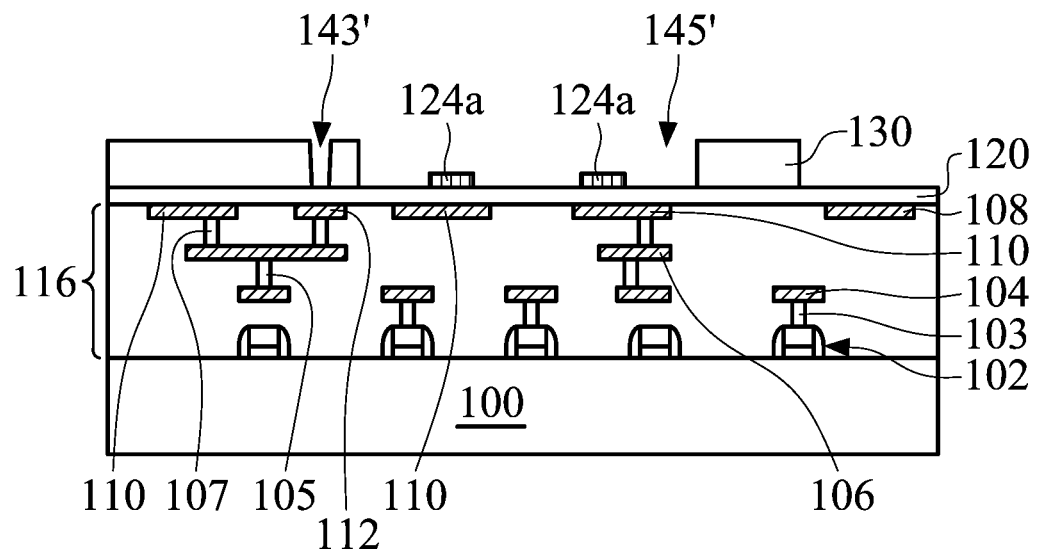
FIGS. 6A to 6F are cross-sectional views of various stages of a method of forming the MEMS package shown in FIG. 3, in accordance with some embodiments.

As shown in FIG. 6A, a structure shown in FIG. 4B is provided, in accordance with some embodiments. Afterwards, a second planarization layer 140 is formed and patterned by similar methods shown in FIGS. 4C and 4D, in accordance with some embodiments. As a result, openings 143' and 145' are formed in the second planarization layer 140 to expose first planarization layer 120 and correspond to the metal pad 112 and the metal lines 110, respectively.

In alternative embodiments, the openings 143' and 145' may not pass through the second planarization layer 140, such that portions of the second planarization layer 140 remain in the bottom of the openings 143' and 145'. In these cases, the bottom surface of the openings 143' and 145' may be lower than the top surface of the patterned conductive layer 124a.

Figure 6B:
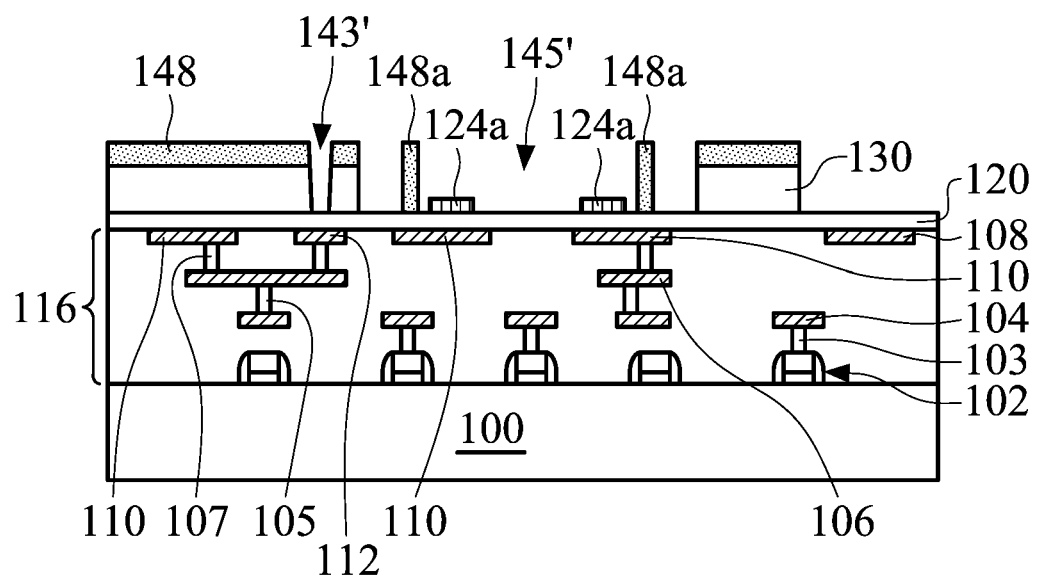

As shown in FIG. 6B, a masking pattern layer 148 is formed over the second planarization layer 130, in accordance with some embodiments. In some embodiments, a masking layer (not shown), such as a photoresist layer, is formed over the second planarization layer 130. Afterwards, the masking layer may be patterned by a photolithography process to form the masking pattern layer 148 with openings aligned with the openings 143' and 145' in the second planarization layer 140. In some embodiments, the masking pattern layer 148 includes island portions 148a in the opening 145' and adjacent to the respective patterned conductive layer 124a.

Figure 6C:
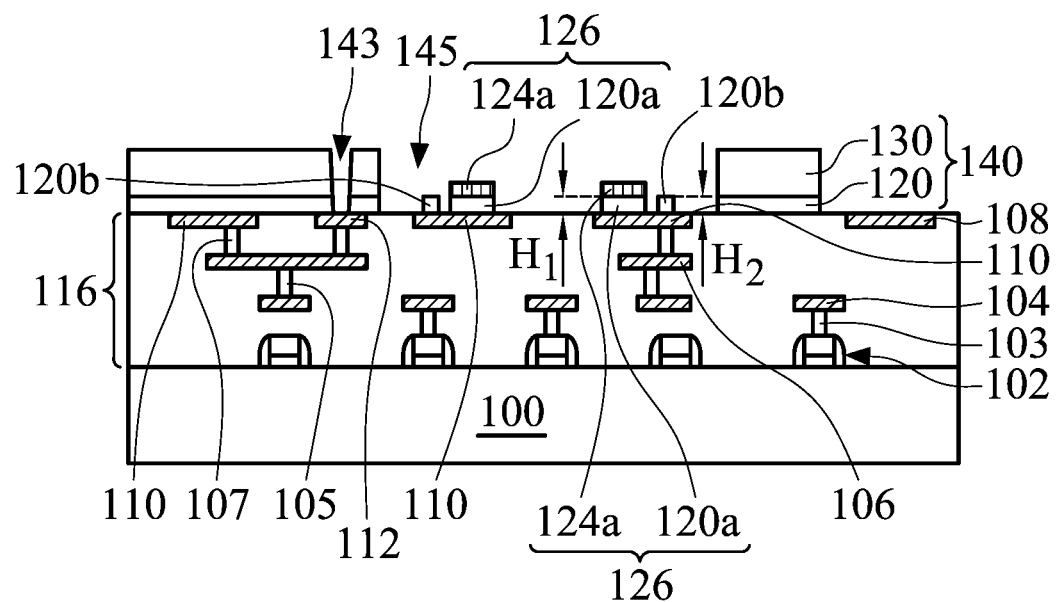

As shown in FIG. 6C, the first planarization layer 120 is etched using the masking pattern layer 148 as an etch mask, in accordance with some embodiments. In some embodiments, a dry etching is performed on portions of the first planarization layer 120 that are uncovered by the masking pattern layer 148, so as to expose the metallization layer 116. As a result, the metal pad 108 is exposed. Moreover, a through hole 143 and a first cavity 145 are formed in a planarization structure 140 including the first and second planarization layers 120 and 130, so as to expose the metal pad 112 and the metal lines 110 of the metallization layer 116, respectively. Additionally, first stoppers 126 and second stoppers 120b are formed on the exposed metallization layer 116 in the first cavity 145 after the etching process. Afterwards, the masking pattern layer 148 including the island portions 148a may be removed from the planarization structure 140 by a stripping or ashing process. Each of the formed first stoppers 126 includes the patterned conductive layer 124a and an underlying patterned insulating layer

120a. Moreover, each of the formed second stoppers 120b is formed by defining the first planarization layer 120 using the island portions 148a as an etch mask. In these cases, the second stopper 120b has a height H2 substantially equal to a height H1 of the patterned insulating layer 120a of the first stopper 126.

In alternative embodiments, each of the formed second stoppers 120b is formed by defining the second and first planarization layers 130 and 120 using the island portions 148a as an etch mask when the openings 143' and 145' shown in FIG. 6A do not pass through the second planarization layer 140. In these cases, the second stopper 120b has a height greater than a height of the patterned insulating layer 120a of the first stopper 126.

Figure 6D:
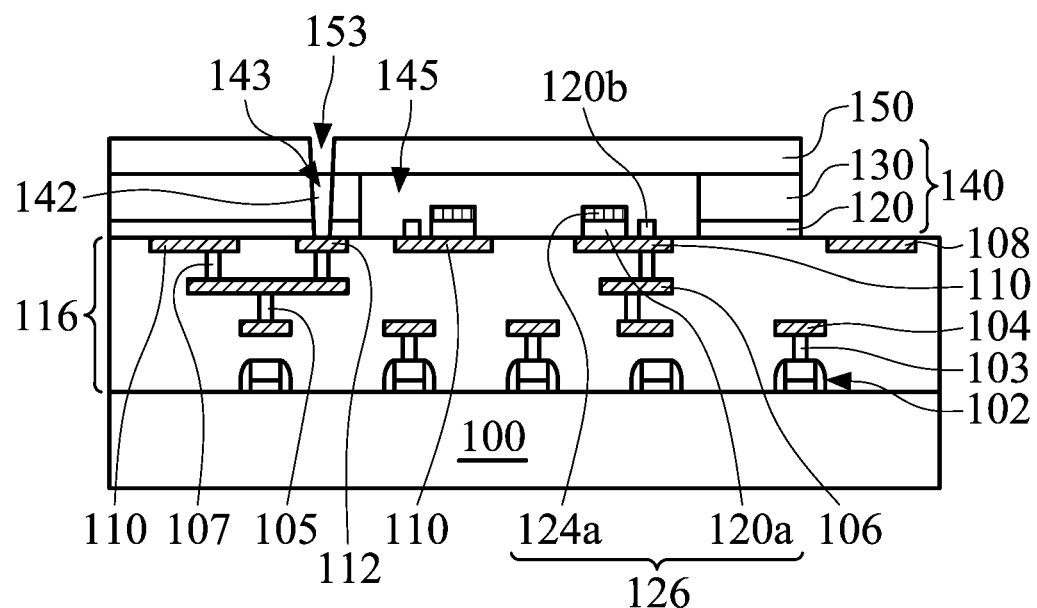
Figure 6E:
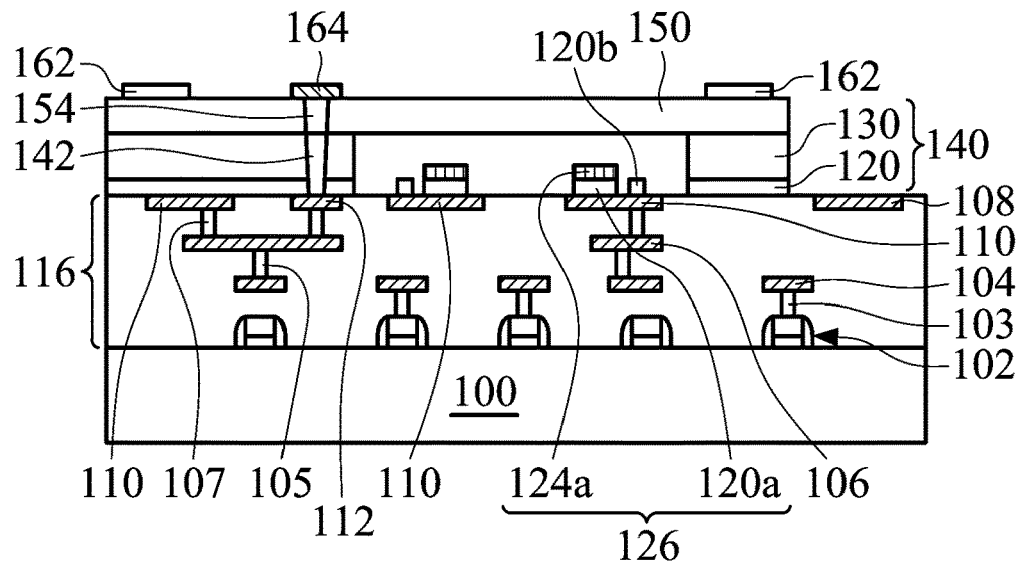
Figure 6F:
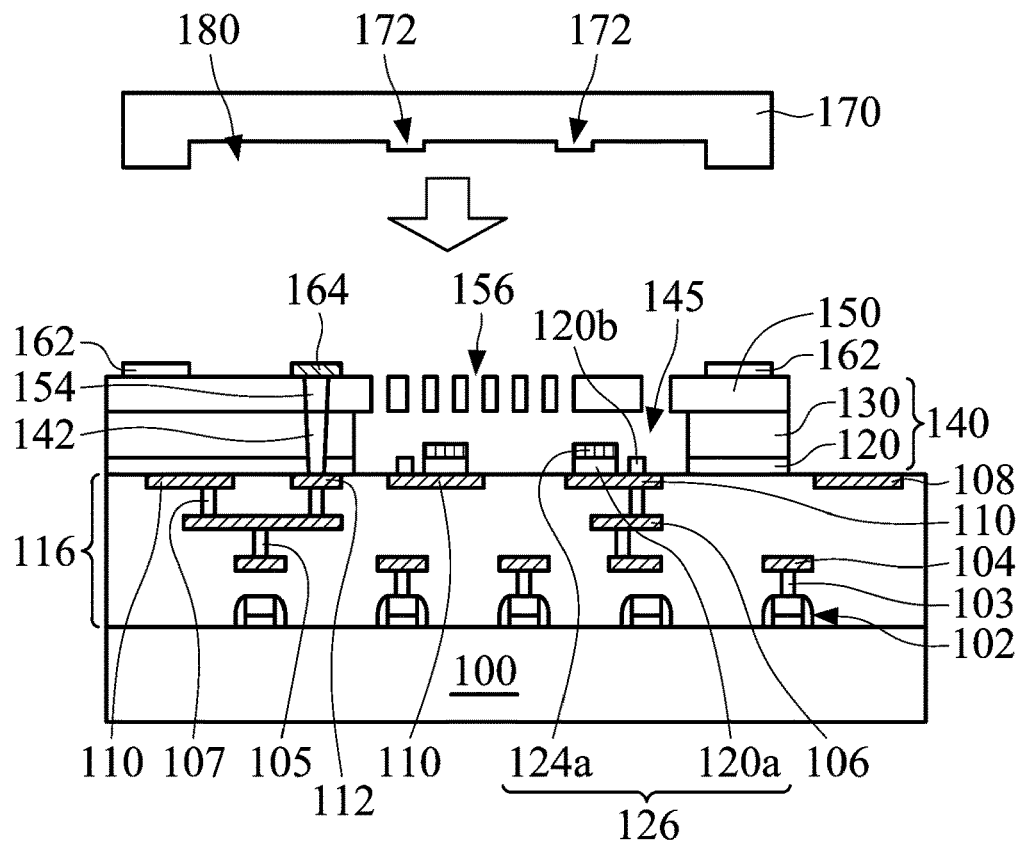

As shown in FIG. 6D, a conductive through via 142 (which is sometimes referred to as TIV) fills the through hole 143 by the method shown in FIG. 4E, so as to be electrically connected to the metal pad 112. Afterwards, a MEMS device structure (such as a motion sensor structure) is formed over the planarization structure 140, in accordance with some embodiments, as shown in FIGS. 6D to 6F. In FIG. 6D, a device substrate 150 with a through hole 153 exposing the conductive through via 142 is provided and bonded to the planarization structure 140 by the method shown in FIG. 4E.

As shown in FIG. 6E a conductive through via 154, a bonding layer 162, and a metal pad 164 are formed by the method shown in FIG. 4F, in accordance with some embodiments. The conductive through via 154 (such as a TIV)) fills the through hole 153 and is electrically connected to the metal pad 112 via the conductive through via 142. In some embodiments, a single-layer conductive through via may be used instead of the conductive through vias 154 and 142 to fill the through holes 143 and 153.

As shown in FIG. 6F, a device substrate 150 that includes a moveable element 156 surrounded by a fixed portion is formed by the method shown in FIG. 4G, in accordance with some embodiments. The moveable element 156 is over and corresponding to the first cavity 145 and a fixed portion surrounding the moveable element 156. The fixed portion is fixed onto the planarization structure 140 to support the moveable element 156. Moreover, the metal pad 164 may be over the fixed portion of the device substrate 150 and the moveable element 156 is controlled by the underlying IC structure via the metal pads 112 and 164 and the conductive through vias 142 and 154 therebetween.

As shown in FIG. 6F, a cap layer 170 is formed over and bonded to the MEMS device structure by the method shown in FIG. 4G, in accordance with some embodiments. In some embodiments, the cap layer 170 includes a second cavity 180 over the moveable element 156. In some embodiments, the cap layer 170 includes third stoppers 172 integrated with the cap layer 170 and facing the moveable element 156. In some embodiments, the third stoppers 172 may or may not be aligned with the first stoppers 126, respectively. As a result, the MEMS package 30 is formed, as shown in FIG. 3.

Embodiments of the disclosure provide structures and formation methods of MEMS packages. According to foregoing embodiments of the disclosure, the MEMS package includes a bilayer stopper including a conductive layer and an underlying insulating layer. The conductive layer of the bilayer stopper serves as a buffer layer to mitigate any colliding force caused by a moveable element during a shock event, thereby protecting the underlying insulating layer from damage. Moreover, the insulating layer of the bilayer stopper enhances the rigid strength of the entire stopper. Therefore, the reliability of the stoppers is increased and the strength of the stoppers is also improved.

Moreover, the bilayer stopper further includes a conductive connector in the insulating layer. The conductive connector is electrically connected between the conductive layer and an underlying metal feature that is electrically connected to ground or an electric potential that is the same as that coupling to the moveable element. Therefore, charge accumulation of the stopper can be eliminated or mitigated, thereby reducing the chance of charge-induced stiction. Moreover, since the conductive layer (e.g., metal) of the bilayer stopper has a low surface energy, the chance of Van Der Waals stiction is also reduced.

Additionally, additional stoppers that have a height less than that of the bilayer stoppers are placed in the MEMS package and adjacent to the respective bilayer stoppers. The additional stoppers advantageously help the bilayer stoppers to withstand the colliding force caused by the movable element. Therefore, the reliability and strength of the stopper structure in the MEMS package is improved further.

In accordance with some embodiments, a MEMS package is provided. The MEMS package includes a semiconductor substrate having a metallization layer over the semiconductor substrate. The MEMS package also includes a first planarization layer and an overlying second planarization layer over the metallization layer. The planarization structure has a first cavity therein exposing the metallization layer. The MEMS package also includes a MEMS device structure bonded to the second planarization layer. The MEMS device structure includes a moveable element over the first cavity. The MEMS package also includes a first stopper placed on the exposed metallization layer in the first cavity. The first stopper includes a patterned conductive layer and an underlying patterned insulating layer.

In accordance with some embodiments, a MEMS package is provided. The MEMS package includes a semiconductor substrate having a metallization layer over the semiconductor substrate. The MEMS package also includes a planarization structure over the metallization layer and having a first cavity exposing the metallization layer. The MEMS package also includes a MEMS device structure bonded to the planarization structure. The MEMS device structure includes a moveable element over the first cavity. The MEMS package also includes a first stopper and a second stopper placed on the exposed metallization layer in the first cavity. The first stopper has a height greater than that of the second stopper. The first stopper includes a patterned conductive layer and an underlying patterned insulating layer.

In accordance with some embodiments, a method for forming a MEMS package is provided. The method includes providing a semiconductor substrate having a metallization layer over the semiconductor substrate. The method also includes forming a first planarization layer over the metallization layer. The first planarization layer is made of an insulating material. The method also includes forming a patterned conductive layer on the first planarization layer and forming a second planarization layer over the first planarization layer and covering the patterned conductive layer. The first planarization layer and the second planarization layer constitute a planarization structure. The method also includes successively recessing the second planarization layer and the first planarization layer to form a first cavity exposing the metallization layer and a first stopper on the exposed metallization layer in the first cavity. The first stopper includes the patterned conductive layer and an underlying patterned insulating layer that is formed by recessing the first planarization layer. The first stopper includes forming a MEMS device structure over the planarization structure and the metallization layer. The MEMS device structure includes a moveable element over the first cavity. The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A microelectromechanical systems (MEMS) package, comprising:
   a semiconductor substrate having a metallization layer over the semiconductor substrate;
   a first planarization layer over the metallization layer and a second planarization layer over the first planarization layer, wherein the first and second planarization layers have an inner sidewall defining a first cavity therein exposing the metallization layer;
   a MEMS device structure bonded to the second planarization layer, wherein the MEMS device structure comprises a moveable element over the first cavity; and
   a first stopper placed on the exposed metallization layer and in the first cavity, comprising a patterned conductive layer and an underlying patterned insulating layer, wherein the inner sidewall of the first and second planarization layers is entirely spaced apart from the first stopper.

2. The MEMS package as claimed in claim 1, wherein the metallization layer comprises a first metal feature below a bottom of the first cavity, and the first stopper further comprises a conductive connector in the patterned insulating layer, such that the patterned conductive layer is electrically connected to the first metal feature through the conductive connector.

3. The MEMS package as claimed in claim 2, wherein the first metal feature is electrically connected to ground.

4. The MEMS package as claimed in claim 2, wherein the metallization layer further comprises a second metal feature that is coupled to an electric potential and is electrically connected between the first metal feature and the moveable element.

5. The MEMS package as claimed in claim 1, further comprising a second stopper placed on the exposed metallization layer in the first cavity, wherein the second stopper is made of the same material as the patterned insulating layer of the first stopper and the first planarization layer, and the second stopper has a height substantially equal to that of the patterned insulating layer of the first stopper.

6. The MEMS package as claimed in claim 1, further comprising a second stopper placed on the exposed metallization layer in the first cavity, wherein the second stopper is made of material layers that are the same as the first planarization layer and the second planarization layer, and the second stopper has a height greater than that of the patterned insulating layer of the first stopper.

7. The MEMS package as claimed in claim 1, wherein the patterned conductive layer comprises metal or conductive polymer, and the patterned insulating layer comprises silicon oxide, silicon nitride, silicon carbide, or silicon oxynitride.

8. A microelectromechanical systems (MEMS) package, comprising:
   a semiconductor substrate having a metallization layer over the semiconductor substrate;
   a planarization structure over the metallization layer, having an inner sidewall defining a first cavity exposing the metallization layer;
   a MEMS device structure bonded to the planarization structure, wherein the MEMS device structure comprises a moveable element over the first cavity; and
   a first stopper and a second stopper placed on the exposed metallization layer and in the first cavity,
   wherein the inner sidewall of the planarization structure is entirely spaced apart from the first stopper and the second stopper, wherein the first stopper has a height greater than that of the second stopper, and wherein the first stopper comprises a patterned conductive layer and an underlying patterned insulating layer.

9. The MEMS package as claimed in claim 8, wherein the metallization layer comprises a first metal feature below a bottom of the first cavity and electrically connected to ground, and the first stopper further comprises a conductive connector in the patterned insulating layer, such that the patterned conductive layer is electrically connected to the first metal feature through the conductive connector.

10. The MEMS package as claimed in claim 8, wherein the metallization layer comprises a first metal feature below a bottom of the first cavity and a second metal feature coupled to an electric potential and electrically connected between the first metal feature and the moveable element, and the first stopper further comprises a conductive connector in the patterned insulating layer, such that the patterned conductive layer is electrically connected to the first metal feature through the conductive connector.

11. The MEMS package as claimed in claim 8, wherein the second stopper is made of the same material layer as the patterned insulating layer of the first stopper, and the second stopper has a height substantially equal to that of the patterned insulating layer of the first stopper.

12. The MEMS package as claimed in claim 8, wherein the second stopper is made of the same material as that of the planarization structure, and the second stopper has a height greater than that of the patterned insulating layer of the first stopper.

13. The MEMS package as claimed in claim 8, wherein the patterned conductive layer comprises metal or conductive polymer, and the patterned insulating layer comprises silicon oxide, silicon nitride, silicon carbide, or silicon oxynitride.

14. A microelectromechanical systems (MEMS) package, comprising:
   a semiconductor substrate having a metallization layer;
   a planarization structure over the metallization layer, having an inner sidewall defining a first cavity exposing the metallization layer;
   a MEMS device structure bonded to the planarization structure, wherein the MEMS device structure comprises a moveable element over the first cavity;
   a cap layer bonded to the MEMS device structure, having a second cavity over the moveable element; and
   a first stopper placed on the exposed metallization layer and in the first cavity, comprising a patterned conductive layer and an underlying patterned insulating layer, wherein the inner sidewall of the planarization structure is entirely spaced apart from the first stopper.

15. The MEMS package as claimed in claim 14, further comprising a second stopper placed on the exposed metallization layer in the first cavity, wherein the second stopper is made of the same material as the patterned insulating layer of the first stopper and the planarization structure, and wherein the first stopper has a height greater than that of the second stopper.

16. The MEMS package as claimed in claim 15, wherein the cap layer comprises a third stopper facing the moveable element.

17. The MEMS package as claimed in claim 16, wherein the third stopper is aligned with the first stopper.

18. The MEMS package as claimed in claim 14, wherein the metallization layer comprises a first metal feature below a bottom of the first cavity, and the first stopper further comprises a conductive connector in the patterned insulating layer, such that the patterned conductive layer is electrically connected to the first metal feature through the conductive connector.

19. The MEMS package as claimed in claim 18, wherein the metallization layer further comprises a second metal feature that is electrically connected between the first metal feature and the moveable element.

20. The MEMS package as claimed in claim 14, wherein the patterned conductive layer comprises metal or conductive polymer, and the patterned insulating layer comprises silicon oxide, silicon nitride, silicon carbide, or silicon oxynitride.

* * * * *